United States Patent [19]

Merz et al.

[11] 4,146,677

[45] Mar. 27, 1979

[54] RESISTOR MATERIAL, RESISTOR MADE THEREFROM AND METHOD OF MAKING THE SAME

[75] Inventors: Kenneth M. Merz, Gladwyne; Howard E. Shapiro, Philadelphia, both of Pa.

[73] Assignee: TRW Inc., Cleveland, Ohio

[21] Appl. No.: 825,525

[22] Filed: Aug. 18, 1977

[51] Int. Cl.[2] ........................ H01C 17/06; H01L 7/00

[52] U.S. Cl. .................................... 428/428; 428/432; 428/539; 252/518; 338/308

[58] Field of Search ........... 427/101, 102, 126, 376 A, 427/432, 428, 539; 252/518; 338/308

[56] References Cited

U.S. PATENT DOCUMENTS

| | | | |
|---|---|---|---|
| 3,232,822 | 2/1966 | Bush | 427/376 A |
| 3,264,229 | 8/1966 | Klein | 252/518 |
| 3,275,471 | 9/1966 | Lowell | 427/376 A |
| 3,496,512 | 2/1970 | Matsuoka et al. | 252/518 |
| 3,503,029 | 3/1970 | Matsuoka | 252/518 |
| 3,577,355 | 5/1971 | Blum | 427/101 |
| 3,598,763 | 8/1971 | Matsuoka et al. | 252/518 |
| 3,663,458 | 5/1972 | Masuyama | 252/518 |
| 4,041,436 | 8/1977 | Konchich et al. | 428/432 |
| 4,051,074 | 9/1977 | Asada | 252/518 |
| 4,061,599 | 12/1977 | Marlor | 252/518 |

OTHER PUBLICATIONS

Matsuoka, "Voltage . . . Metal Oxide," Japan J. Appl. Physics, 8, pp. 1275-1276, (1969).

Matsuoka, Nonohmic Properties . . . Ceramics", Japan J. Appl. Physics, vol. 10, No. 6, (6-1971), pp. 736-746.

Hahn, "Some Electrical Properties . . . ZnO Semiconductor", J. of Applied Physics, vol. 22, No. 7, pp. 855-863, (7-1951).

Mollwo, "Electrical . . . ZnO", Photoconductivity Conf. Atlantic City, (1954), pp. 509-528.

Thomas et al., "Hydrogen as a Donor in ZnO", Journal of Chemical Physics, vol. 25, No. 6, (12-1956), pp. 1136-1142.

Nielsen, Growth of ZnO . . . Method, J. of Crystal Growth, vol. 3, No. 4, (1968), pp 141-145.

Eger, Oxygen Chemisorption . . . ZnO Surfaces, RCA Review, vol. 36, (9-1975), pp. 508-530.

*Primary Examiner*—Michael F. Esposito

*Attorney, Agent, or Firm*—Jacob Trachtman

[57] ABSTRACT

A vitreous enamel resistor material comprising a mixture of vitreous glass frit and fine particles of zinc oxide (ZnO). An electrical resistor is made from the resistor material by applying the material to a substrate and firing the coated substrate to a temperature at which the glass melts. Upon cooling, the substrate has on a surface thereof a film of glass having the zinc oxide particles embedded therein and dispersed therethroughout. The resistor material provides resistors having a wide range of resistivities with low temperature coefficients of resistance and low voltage coefficients of resistance.

15 Claims, 1 Drawing Figure

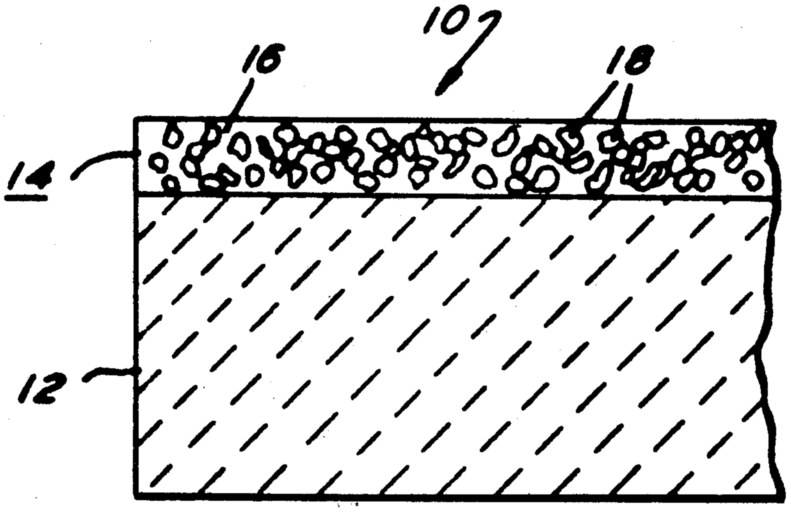
10
16
18
14
12

RESISTOR MATERIAL, RESISTOR MADE THEREFROM AND METHOD OF MAKING THE SAME

The present invention relates to a resistor material, resistors made from the material, and a method of making the same. More particularly, the present invention, relates to a vitreous enamel resistor material which provides resistors having a wide range of resistivities, low temperature coefficients of resistance and low voltage coefficients of resistance, and which are made from relatively inexpensive materials.

A type of electrical resistor material which has recently come into commercial use is a vitreous enamel resistor material which comprises a mixture of a glass frit and finely divided particles of an electrically conductive material. The vitreous enamel resistor material is coated on the surface of a substrate of an electrical insulating material, usually a ceramic, and fired to melt the glass frit. When cooled, there is provided a film of glass having the conductive particles dispersed therein.

Since electrical resistors having a wide range of resistance values are required, it is desirable to have vitreous enamel resistor materials with respective properties which allow the making of such resistors. However, it is also desirable that such resistor materials provide low temperature coefficients of resistance and low voltage coefficients of resistance, so that the resistors are relatively stable with respect to changes in temperature and applied voltage. Heretofore, the resistor materials which had these characteristics generally utilized the noble metals as the conductive particles and were therefore relatively expensive. Although resistor materials of zinc oxide with additives have been used for resistors, they have been generally used in a form which is sensitive to voltage variations, i.e. having a high voltage coefficient of resistance, as shown by the following United States patents:

U.S. Pat. No. 3,496,512 to Matsuoka et al, "Non-Linear Resistors" Feb. 17, 1970

U.S. Pat. No. 3,503,029 to M. Matsuoka, "Non-Linear Resistors" Mar. 24, 1970

U.S. Pat. No. 3,598,763 to M. Matsuoka et al, "Manganese-Modified Zinc Oxide Voltage Variable Resistors" Aug. 10, 1971

U.S. Pat. No. 3,663,458 to T. Masuyama et al, "Non-Linear Resistors of Bulk Type" May 16, 1972

It is, therefore, an object of the present invention to provide a novel resistor material and resistor made therefrom.

It is another object of the present invention to provide a novel vitreous enamel resistor material and a resistor made therefrom.

It is a still further object of the present invention to provide a vitreous enamel resistor material which provides a resistor having a wide range of resistivities, a relatively low temperature coefficient of resistance, and a relatively low voltage coefficient of resistance.

It is another object of the present invention to provide a vitreous enamel resistor material which provides a resistor having a wide range of resistances, a relatively low temperature coefficient of resistance, a relatively low voltage coefficient of resistance and which is of relatively inexpensive material.

Other objects will appear hereinafter.

These objects are achieved by a resistor material comprising a mixture of a glass frit and finely divided particles of zinc oxide.

The invention accordingly comprises a composition of matter possessing the characteristics, properties, and the relation of components which are exemplified in the compositions hereinafter described, and the scope of the invention is indicated in the claims.

For a fuller understanding of the nature and objects of the invention, reference should be had to the following detailed description taken in connection with the accompanying drawing in which:

The FIGURE is a sectional view of a portion of a resistor made with the resistor material of the present invention.

In general, the vitreous enamel resistor material of the present invention comprises a mixture of a vitreous glass frit and fine particles of zinc oxide (ZnO). The zinc oxide is present in the resistor material in the amount of 40% to 90% by volume, and preferably in the amount of 45% to 80% by volume.

The glass frit used may be any of the well known compositions used for making vitreous enamel resistors compositions, and which has a melting point below that of zinc oxide. However, it has been found preferable to use a borosilicate frit, and particularly an alkaline earth borosilicate frit, such as a barium or calcium borosilicate frit. The preparation of such frits is well known and consists, for example, of melting together the constituents of the glass in the form of the oxides of the constituents, and pouring such molten composition into water to form the frit. The batch ingredients may, of course, be any compound that will yield the desired oxides under the usual conditions of frit production. For example, boric oxide will be obtained from boric acid, silicon dioxide will be produced from flint, barium oxide will be produced from barium carbonate, etc. The coarse frit is preferable milled in a ball mill with water to reduce the particle size of the frit and to obtain a frit of substantially uniform size.

The resistor material of the present invention is preferably made by ball milling zinc oxide with a liquid vehicle, such as water. The liquid vehicle is then evaporated and the remaining powder is then preferably heated in an atmosphere of nitrogen with up to 15% hydrogen to a peak temperature between 25° C. to 1000° C. for a ½ to 2 hour cycle in a conveyor belt furnace. The heat treated zinc oxide is then mixed with the glass frit in the appropriate proportions. The mixing is preferably carried out by ball milling the ingredients in an organic medium, such as butyl carbitol acetate. The mixture is then adjusted to the proper viscosity for the desired manner of applying the resistor material to a substrate by either adding or removing the liquid medium of the mixture.

To make a resistor with the resistor material of the present invention, the resistor material is applied to a uniform thickness on the surface of a substrate. The substrate may be a body of any material which can withstand the firing temperature of the resistor material. The substrate is generally a body of an insulating material such as ceramic, glass, porcelain, steatite, barium titanate, alumina, or the like. The resistor material may be applied on the substrate by brushing, dipping, spraying, or screen stencil application. The substrate with the resistor material coating is then fired in a conventional furnace at a temperature at which the glass frit becomes molten. The resistor material is preferably fired in an inert or non-oxidizing atmosphere, such as argon, helium or nitrogen. The firing temperature used depends on the melting temperature of the particular glass frit used. When the substrate and resistor material are cooled, the vitreous enamel hardens to bond the resistance material to the substrate.

As shown in the FIGURE of the drawing, a resultant resistor of the present invention is gradually designated as 10. Resistor 10 comprises a ceramic substrate 12 having a layer 14 of the resistor material of the present invention coated and fired thereon. The resistor material layer 14 comprises the glass 16 containing the finely divided particles 18 of zinc oxide embedded in and dispersed throughout the glass.

The following examples are given to illustrate certain preferred details of the invention, it being understood that the details of the examples are not to be taken as in any way limiting the invention thereto.

EXAMPLE I

Batches of a resistor material were made by mixing together powdered zinc oxide and a glass frit of the composition of by weight 48.5% barium oxide (BaO), 7.7% calcium oxide (CaO), 23.3% boron oxide ($B_2O_3$), and 20.7% silicon dioxide ($SiO_2$). Each of the batches contained a different amount of the zinc oxide ranging from 40% to 55% by volume. Each of the batches was ball milled in butyl carbitol acetate.

Each of the resistor materials was coated on rods of Alsimag 614 alumina which had uniformily spaced notches along their length. This coating operation was achieved by dipping the rods into the resistor material. The rods were dried in air at 150° C. for ½ hour in a vertical position and then fired in a horizontal position at 725° C. in a nitrogen atmosphere over a ½ hour cycle in a conveyor belt furnace. Each of the rods was then coated with bands of a silver conductive material at its ends and at each of the notches, and the conductive material was cured at 200° C. for one hour. The rods were then broken apart at the notches to form individual resistors, and terminals were attached to the ends of the resistors. The resistances of the resistors were measured and the resistors were tested for determining their temperature coefficients of resistance and their voltage coefficients of resistance. The results of these tests are shown in Table I by giving the average value obtained from testing a plurality of resistors of each group.

TABLE I

| | | | | |
|---|---|---|---|---|
| Zinc Oxide (% by volume) | 40 | 45 | 50 | 55 |
| Resistance (ohms/square) | 1600K | 68K | 26K | 22K |
| Temperature coeff. of Resistance (PPM/° C.) | | | | |
| +150° C. | −478 | 62 | 186 | 86 |
| −55° C. | −462 | 0 | 182 | 196 |
| Voltage coeff. of Resistance (%/volt) | −.037 | −.0015 | −.0001 | −.0026 |

EXAMPLE II

Batches of a resistor material were made by first heating powdered zinc oxide at 800° C. in an atmosphere of 95% nitrogen and 5% hydrogen. The heat treated zinc oxide was then mixed with the glass frit of the composition set forth in EXAMPLE I, with each batch containing a different amount of the zinc oxide ranging from 60% to 85% by volume. The glass frit and zinc oxide mixtures were mixed in a screening medium.

Resistors were made from each batch of the resistor material by screen printing the resistor materials onto the surface of a ceramic substrate. After drying the coating, the coated substrates were fired at 750° C. in a nitrogen atmosphere over a ½ hour cycle in a conveyor belt furnace. The average resistance, temperature coefficient of resistance and voltage coefficient of resistance of the resultant resistors are shown in Table II.

TABLE II

| | | | | |
|---|---|---|---|---|
| Zinc Oxide (% by volume) | 60 | 75 | 80 | 85 |
| Resistance (ohms/square) | 115K | 25K | 13K | 10K |
| Temperature coeff. of Resistance (PPM/° C.) | | | | |
| +150° C | −304 | −230 | −84 | −337 |
| −55° C | −362 | −385 | −281 | −665 |
| Voltage coeff. of Resistance (%/volt) | −.0369 | −.028 | −.0014 | −.028 |

EXAMPLE III

A resistor material was made by mixing together 90% by volume of zinc oxide powder and 10% by volume of the glass frit described in EXAMPLE I. The mixture was blended with a screening medium. The resistor material was screen printed on the surface of ceramic substrates, and the coated substrates were fired at 800° C. in a nitrogen atmosphere over a ½ hour cycle in a coveyor belt furnace. The resultant resistors had the following average electrical characteristics:

| | |
|---|---|
| Resistance (ohms/square) | 6K |
| Temperature coeff. of Resistance (PPM/° C.) | |
| +150° C. | −1136 |
| −55° C. | −1198 |
| Voltage Coeff. of Resistance (%/volt) | −.0018 |

EXAMPLE IV

Resistors were made in the manner described in EXAMPLE III except that the resistor material contained 60% by volume of the zinc oxide and the coated substrates were fired at 750° C. The resultant resistors had the following average electrical characteristics:

| | |
|---|---|
| Resistance (ohms/Square) | 13K |
| Temperature coeff. of Resistance (PPM/° C.) | |
| +150° C. | ±53 |
| −55° C. | −99 |
| Voltage coeff. of Resistance (%/volt) | −.0048 |

EXAMPLE V

A resistor material was made by first heating zinc oxide particles at 550° C. in an atmosphere of 95% nitrogen and 5% hydrogen. The heat treated zinc oxide was mixed with the glass frit of the composition described in EXAMPLE I with the mixture containing 60% by volume of the zinc oxide and the mixing was done in butyl carbitol acetate. Resistors were made from the resistor material as described in EXAMPLE I, except that the coated rods were fired at 750° C. The resultant resistors had the following average electrical characteristics:

| | |
|---|---|
| Resistance (ohms/square) | 10K |
| Temperature coeff. of Resistance (PPM/° C.) | |
| +150° C. | 208 |
| −55° C. | 236 |
| Voltage coeff. of Resistance (%/volt) | −.0006 |

EXAMPLE VI

Resistors were made in the manner described in EXAMPLE V, except that the zinc oxide was heat treated at 800° C. before being mixed with the glass frit. The resultant resistors had the following average electrical characteristics:

| | |
|---|---|
| Resistance (ohms/square) | 8K |
| Temperature coeff. of Resistance (PPM/° C.) | |
| +150° C. | 101 |
| −55° C. | 94 |
| Voltage coeff. of Resistance (%/volt) | −.0026 |

EXAMPLE VII

Resistors were made in the same manner as described in EXAMPLE V, except that the zinc oxide was heat treated at 960° C. prior to being mixed with the glass frit. The resultant resistors had the following average electrical characteristics:

| | |
|---|---|
| Resistance (ohms/square) | 35K |
| Temperature coeff. of Resistance (PPM/° C.) | |
| +150° C. | −442 |
| −55° C. | −501 |
| Voltage coeff. of Resistance (%/volt) | −.016 |

EXAMPLE VIII

Resistors were made in the same manner as described in EXAMPLE V, except that the zinc oxide was heat treated at 800° C. in an atmosphere of nitrogen prior to being mixed with the glass frit. The resultant resistors had the following average electrical characteristics:

| | |
|---|---|
| Resistance (ohms/square) | 58K |
| Temperature coeff. of Resistance (PPM/° C.) | |
| +150° C. | −306 |
| −55° C. | −302 |
| Voltage coeff. of Resistance (%/volt) | −.0016 |

EXAMPLE IX

Resistors were made in the same manner as described in EXAMPLE V, except that the zinc oxide was heat treated at 960° C. in an atmosphere of nitrogen prior to being mixed with the glass frit. The resultant resistors had the following average electrical characteristics:

-continued

| | |
|---|---|
| Resistance (ohms/square) | 170K |
| Temperature coeff. of Resistance (PPM/° C.) | |
| +150° C. | −421 |
| −55° C. | −342 |
| Voltage coeff. of Resistance (%/volt) | −.067 |

EXAMPLE X

Resistors were made in the same manner as described in EXAMPLE V, except that the coated rods were fired at 700° C. The resultant resistors had the following average electrical characteristics:

| | |
|---|---|
| Resistance (ohms/square) | 27K |
| Temperature coeff. of Resistance (PPM/° C.) | |
| +150° C. | −288 |
| −55° C. | 20 |
| Voltage coeff. of Resistance (%/volt) | −.0005 |

EXAMPLE XI

Resistors were made in the same manner as described in EXAMPLE V, except that the coated rods were fired at 800° C. The resultant resistors had the following average electrical characteristics:

| | |
|---|---|
| Resistance (ohms/square) | 10K |
| Temperature coeff. of Resistance (PPM/° C.) | |
| +150° C. | −495 |
| −55° C. | −399 |
| Voltage coeff. of Resistance (%/volt) | −.0026 |

EXAMPLE XII

Resistors were made in the same manner as described in EXAMPLE V, except that the zinc oxide was heat treated at 800° C. before being mixed with the glass frit and the coated rods were fired at 850° C. The resultant resistors had the following electrical characteristics:

| | |
|---|---|
| Resistance (ohms/square) | 6K |
| Temperature coeff. of Resistance (PPM/° C.) | |
| +150° C. | −958 |
| −55° C. | −887 |
| Voltage coeff. of Resistance (%/volt) | −.0058 |

From the above Examples there can be seen, the effects on the electrical characteristics of the resistor of the present invention of variations in the composition of the resistor material, and the method of making the resistor. EXAMPLES I, II and III show the effects of varying the amount of the zinc oxide in the resistor material. EXAMPLES IV–IX show the effects of heat treating the zinc oxide prior to mixing it with the glass frit. EXAMPLES X–XII show the effects of varying the firing temperature of the resistor material.

Although the above examples do not disclose vitreous enamel resistor materials in which additional metals are added to the zinc oxide conductive phase, or the resulting resistors and their characteristics and the method of making same, our co-pending application Serial No. 825,600 entitled Resistor Material, Resistor Made Therefrom And Method Of Making The Same and filed on the same date as the present application includes such examples which are incorporated herein by reference. More specifically, our co-pending application discloses vitreous enamel resistor materials comprising a mixture of a vitreous glass frit and fine particles of a mixture of zinc oxide and a material which will provide either lithium, tin, nickel, aluminum, indium, titanium, tantalum, zinc, gallium, vanadium, tungsten, or molybdenum, the method for producing resistors therefrom, and the resistors produced which have electrical characteristics including low temperature coefficients of resistance and low voltage coefficients of resistance.

It will thus be seen that the objects set forth above among those made apparent from the preceding description, are efficiently attained and, since certain changes may be made in the above compositions of matter without departing from the scope of the invention, it is intended that all matter contained in the above description shall be interpreted as illustrative and not in a limiting sense.

What we claim is:

1. An electrical resistor comprising a ceramic substrate and a resistor material on a surface of said substrate, said resistor material having a conductive phase consisting of particles of zinc oxide embedded in and dispersed throughout a glass.

2. An electrical resitor in accordance with claim 1 in which the resistor material contains 40% to 90% by volume of the zinc oxide.

3. An electrical resistor in accordance with claim 2 in which the resistor material contains 50% to 80% by volume of the zinc oxide.

4. An electrical resistor in accordance with claim 3 in which the glass is a borosilicate glass.

5. An electrical resistor in accordance with claim 4 in which the glass is an alkaline earth borosilicate glass.

6. An electrical resistor comprising a substrate of an electrical insulating material and a resistance layer on a surface of said substrate, said resistance layer being formed by mixing together a glass frit and particles for providing a conductive phase consisting of zinc oxide, coating said mixture on the surface of the substrate, firing said coated substrate in a non-oxidizing atmosphere at a temperature at which the glass frit melts, and then cooling the coated substrate.

7. An electrical resistor in accordance with claim 6 in which the zinc oxide is heat treated in an atmosphere of nitrogen with up to 15% hydrogen at a temperature of 25° C. to 1000° C. prior to being mixed with the glass frit.

8. An electrical resistor in accordance with claim 6 in which the glass frit and zinc oxide are mixed together in a vehicle and the coating is dried prior to firing the coated substrate.

9. An electrical resistor in accordance with claim 8 in which the mixture contains 40% to 90% by volume of the zinc oxide.

10. An electrical resistor in accordance with claim 9 in which the mixture contains 45% to 80% by volume of the zinc oxide.

11. A method of making an electrical resistor comprising the steps of mixing together a glass frit and particles for providing a conductive phase consisting of zinc oxide, coating the mixture onto the surface of a substrate of an electrical insulating material, firing said coated substrate in a non-oxidizing atmosphere at a temperature at which the glass frit melts, and then cooling said coated substrate.

12. The method of making an electrical resistor in accordance with claim 11 in which the zinc oxide is heat treated in an atmosphere of nitrogen with up to 15% hydrogen at a temperature of 25° C. to 1000° C. prior to being mixed with the glass frit.

13. The method of making an electrical resistor in accordance with claim 11 in which the glass frit and zinc oxide are mixed together in a vehicle and the coating is dried before being fired.

14. The method of making an electrical resistor in accordance with claim 11 in which the mixture contains 40% to 90% by volume of the zinc oxide.

15. The method of making an electrical resistor in accordance with claim 14 in which the mixture contains 45% to 80% by volume of the zinc oxide.

* * * * *